US010707303B1

(12) United States Patent
Wang et al.

(10) Patent No.: US 10,707,303 B1
(45) Date of Patent: Jul. 7, 2020

(54) METHOD, APPARATUS, AND SYSTEM FOR IMPROVING SCALING OF ISOLATION STRUCTURES FOR GATE, SOURCE, AND/OR DRAIN CONTACTS

(71) Applicant: GLOBALFOUNDRIES INC., Grand Cayman (KY)

(72) Inventors: Haiting Wang, Clifton Park, NY (US); Hui Zang, Guilderland, NY (US); Zhenyu Owen Hu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/264,273

(22) Filed: Jan. 31, 2019

(51) Int. Cl.
*H01L 29/66* (2006.01)
*H01L 29/06* (2006.01)
*H01L 29/08* (2006.01)
*H01L 21/762* (2006.01)

(52) U.S. Cl.
CPC .... *H01L 29/0653* (2013.01); *H01L 21/76224* (2013.01); *H01L 29/0843* (2013.01)

(58) Field of Classification Search
CPC ........... H01L 29/0653; H01L 21/76224; H01L 29/0843

USPC .......................................................... 257/330
See application file for complete search history.

(56) References Cited

U.S. PATENT DOCUMENTS

| 8,053,327 | B2* | 11/2011 | Mishra | .............. | H01L 21/76232 |
| | | | | | 438/407 |
| 9,620,590 | B1* | 4/2017 | Bergendahl | ......... | H01L 29/0673 |
| 10,535,525 | B2* | 1/2020 | Lin | ..................... | H01L 29/7848 |
| 2019/0006345 | A1* | 1/2019 | Wang | .............. | H01L 21/823481 |

* cited by examiner

*Primary Examiner* — Vu A Vu
(74) *Attorney, Agent, or Firm* — Williams Morgan, P.C.

(57) ABSTRACT

A semiconductor device, comprising a semiconductor substrate; an isolation layer disposed on the semiconductor substrate; a first active region and a second active region disposed at least partially above the isolation layer; a first gate structure and a second gate structure disposed on the isolation layer, the first active region, and the second active region; and an isolation pillar disposed on the isolation layer, between the first and second active regions, and between and in contact with the first and second gate structures, wherein the isolation pillar has an inverted-T shape. A method for making the semiconductor device. A system configured to implement the method and manufacture the semiconductor device.

18 Claims, 14 Drawing Sheets

US 10,707,303 B1

METHOD, APPARATUS, AND SYSTEM FOR IMPROVING SCALING OF ISOLATION STRUCTURES FOR GATE, SOURCE, AND/OR DRAIN CONTACTS

BACKGROUND OF THE INVENTION

Field of the Invention

Generally, the present disclosure relates to sophisticated semiconductor devices, and, more specifically, to semiconductor devices with improved scaling of isolation structures for contacts to gates, sources, and/or drains.

Description of the Related Art

In an effort to maintain Moore's Law as a self-fulfilling prophecy, the semiconductor industry in recent years has sought to reduce the sizes of semiconductor devices. Efforts to do so have led to the development of FinFET devices, in which a gate electrode is disposed on the tops and sides of a fin providing the gate channel. Sources and drains may be formed in or on the fin in proximity to the gate.

Gate electrodes, sources, and drains require contacts, frequently comprising metal, to allow signals to travel to and from the gate, source, and drain on the one hand and other components of the semiconductor device on the other. Efforts to form contacts under a regime calling for reduced size of a FinFET have led to the use of self-aligned contacts. However, for self-aligned contacts (SAC) require a relatively large lateral excess, to minimize the risk of a manufacturing failure in which the contacts are insufficiently aligned to the underlying gate, source, or drain. Known SAC techniques are generally only capable of providing sufficient alignment at dimensions of about 30 nm or above.

Accordingly, it would be desirable to have a semiconductor device improved scaling of isolation structures for contacts to gates, sources, and/or drains.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment, the present disclosure is directed to a semiconductor device, comprising a semiconductor substrate; an isolation layer disposed on the semiconductor substrate; a first active region and a second active region disposed at least partially above the isolation layer, wherein the first active region and the second active region each comprise a long axis and a short axis, wherein the long axes of the first and second active regions are substantially parallel and extend in a first direction; a first gate structure and a second gate structure disposed on the isolation layer, the first active region, and the second active region, wherein the first gate structure and the second gate structure each comprise a long axis and a short axis, wherein the long axes of the first and second gate structures are substantially parallel and extend in a second direction, wherein the second direction is substantially perpendicular to the first direction; and an isolation structure disposed on the isolation layer, between the first and second active regions, and between and in contact with the first and second gate structures.

In one embodiment, the present disclosure is directed to a method, comprising providing a semiconductor substrate; providing an isolation layer disposed on the semiconductor substrate; forming a first active region and a second active region disposed at least partially above the isolation layer, wherein the first active region and the second active region each comprise a long axis and a short axis, wherein the long axes of the first and second active regions are substantially parallel and extend in a first direction; forming a first gate structure and a second gate structure disposed on the isolation layer, the first active region, and the second active region, wherein the first gate structure and the second gate structure each comprise a long axis and a short axis, wherein the long axes of the first and second gate structures are substantially parallel and extend in a second direction, wherein the second direction is substantially perpendicular to the first direction; forming a high-κ material on the isolation layer, the first active region, the second active region, the first gate structure, and the second gate structure, such that a rectangular portion of the isolation layer between the first active region and the second active region, and between and in contact with the first gate structure and the second gate structure, remains exposed; forming an isolation pillar material on the rectangular portion of the isolation layer, wherein the isolation pillar material has a rectangular shape in a sectional view taken across the first direction and lower portions of two opposed sides of the isolation pillar material is in contact with the high-κ material; and trimming upper portions of the two opposed sides of the isolation pillar material, wherein the upper portions are above the lower portions, to yield an isolation pillar disposed on the isolation layer, between the first and second active regions, and between and in contact with the first and second gate structures, wherein the isolation pillar has an inverted-T shape in a sectional view taken across the first direction.

In one embodiment, the present disclosure is directed to a manufacturing system, configured to manufacture a semiconductor device, such as the semiconductor device referred to above.

Embodiments herein may provide for improved scaling of isolation structures for contacts to gates, sources, and/or drains in semiconductor devices.

BRIEF DESCRIPTION OF THE DRAWINGS

The disclosure may be understood by reference to the following description taken in conjunction with the accompanying drawings, in which like reference numerals identify like elements, and in which.

Figure 1:
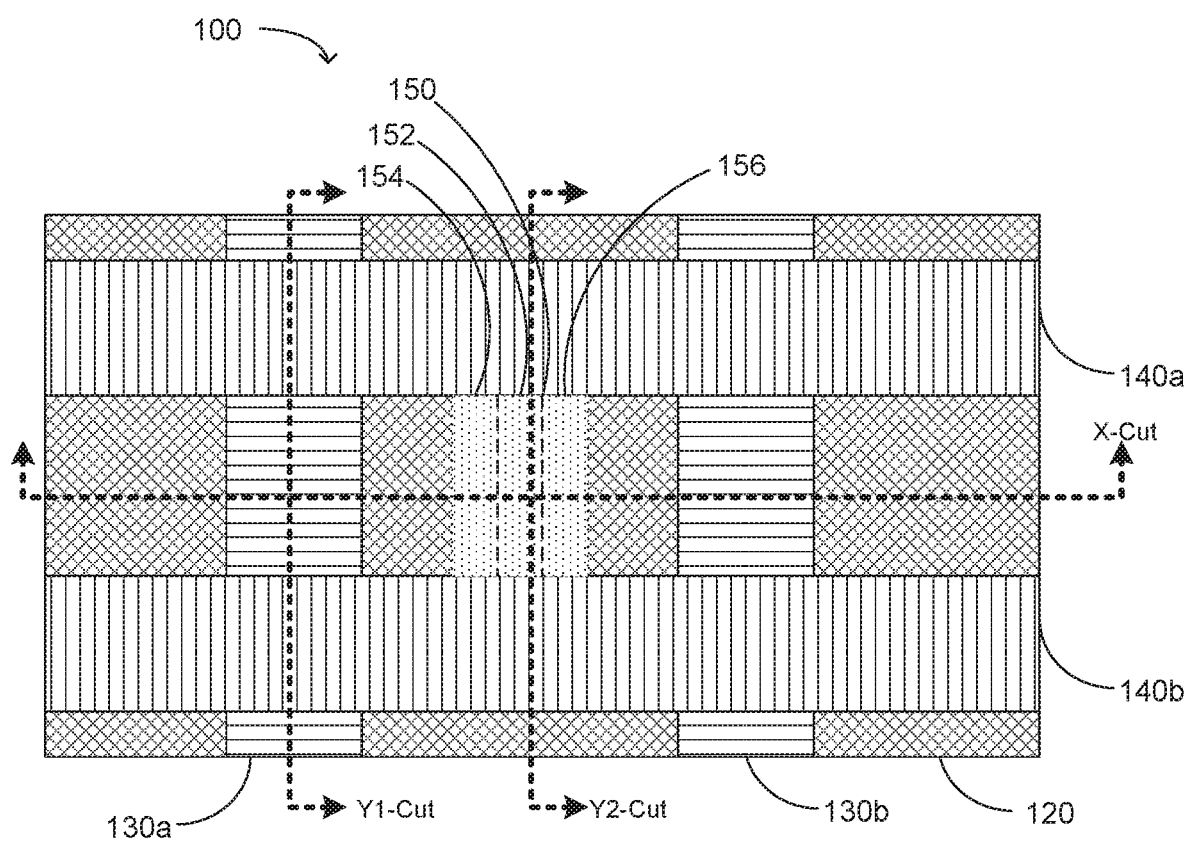
FIG. 1 illustrates a stylized plan view of a semiconductor device, showing X-cut, Y1-cut, and Y2-cut lines, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Moreover, the stylized depictions illustrated in the drawings are not drawn to any absolute scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems, and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for improved scaling of isolation structures for contacts to gates, sources, and/or drains in semiconductor devices.

Turning now to FIG. 1, we provide a stylized plan view of a semiconductor device 100, showing X-cut, Y1-cut, and Y2-cut lines, in accordance with embodiments herein. The plan or top-down view of FIG. 1 may omit one or more layers or structures that would be positioned over part or all of the semiconductor device 100 or one or more components thereof after one or more stages of processing, for convenience in drawing the reader's attention to particular features shown in FIG. 1 and other figures and described below.

One component of the semiconductor device 100 shown in FIG. 1 is an isolation layer 120. The isolation layer 120 provides electrical isolation for various other components of the semiconductor device 100, as will be apparent to the person of ordinary skill in the art. The isolation layer 120 may also be termed a "shallow trench isolation" or "STI." The isolation layer 120 may comprise any material having a low dielectric constant κ, with "low-κ" herein referring to a dielectric constant less than 5. In one embodiment, the isolation layer comprises silicon oxide.

The semiconductor device 100 also comprises a first active region 130a and a second active region 130b disposed at least partially above the isolation layer 120. An "active region" herein refers to a region comprising an electrically-conductive pathway. Examples of active regions which may be used in the present disclosure include nanosheet structures and epitaxial components of fin structures, among others known to the person of ordinary skill in the art. Nanosheet structures and epitaxial components of fin structures will be described in more detail with reference to FIGS. 2A-2B, below. Active regions may comprise silicon, silicon-germanium, or other components that will readily occur to the person of ordinary skill in the art. The particular structure of the active regions 130*a* and 130*b* is not crucial, and may be selected and implemented by the person of ordinary skill in the art as a routine exercise of skill.

As can be seen in the plan view of FIG. 1, the first active region 130*a* and the second active region 130*b* each comprise a long axis (extending vertically on the page) and a short axis (extending horizontally on the page), wherein the long axes of the first and second active regions 130*a* and 130*b* are substantially parallel and extend in a first direction. In the depicted stylized plan view of FIG. 1, the first direction is vertical on the page.

The semiconductor device 100 additionally comprises a first gate structure 140*a* and a second gate structure 140*b*, each disposed on the isolation layer 120, the first active region 130*a*, and the second active region 130*b*. By "gate structure" is meant both dummy gate structures intended for replacement metal gate (RMG) processes and final gate structures (which may be termed a "gate stack") typically comprising a high-κ (i.e., κ>6) gate dielectric layer, a metal gate electrode, and various spacers and capping layers. In one embodiment, the first gate structure 140*a* and the second gate structure 140*b* each comprise a high-κ gate dielectric; a metal gate electrode; a capping layer disposed on the metal gate electrode; and a spacer disposed on sides of the metal gate electrode and sides of the capping layer.

The first gate structure 140*a* and the second gate structure 140*b* each comprise a long axis and a short axis, wherein the long axes of the first and second gate structures are substantially parallel and extend in a second direction (e.g., horizontally on the page in FIG. 1), wherein the second direction is substantially perpendicular to the first direction.

The semiconductor device 100 also comprises an isolation structure, such as an isolation pillar 150. The isolation pillar 150 is disposed on the isolation layer 120, between the first and second active regions 130*a* and 130*b*, and between and in contact with the first and second gate structures 140*a* and 140*b*. In embodiments wherein the gate structures 140*a* and 140*b* comprise a spacer disposed on side of a metal gate electrode and side of a capping layer, the spacer may be in contact with the isolation pillar 150.

In one embodiment, the isolation pillar 150 has an inverted-T shape in a sectional view taken across the first direction (i.e., when seen in X-cut in one or more of the following figures). The inverted-T shape of the isolation pillar 150 is represented in FIG. 1 by the dashed lines running vertically in isolation pillar 150, which delineate three regions of the isolation pillar 150: an upright central portion 152, a first foot 154, and a second foot 156.

The isolation pillar 150 may be formed of any electrically insulating material. In one embodiment, the isolation pillar comprises silicon nitride.

Subsequent stylized cross-sectional depictions of the semiconductor device 100 according to embodiments herein will be taken along one of three cuts, an X-cut (perpendicular to and across the long axis of the active regions 130*a* and 130*b*), a Y1-cut (perpendicular to and across the long axis of one of the gate structures, gate structure 130*a*, and through the first active region 130*a*), and a Y2-cut (perpendicular to the long axes of the gate structures and through the isolation pillar 150).

Figure 2A:
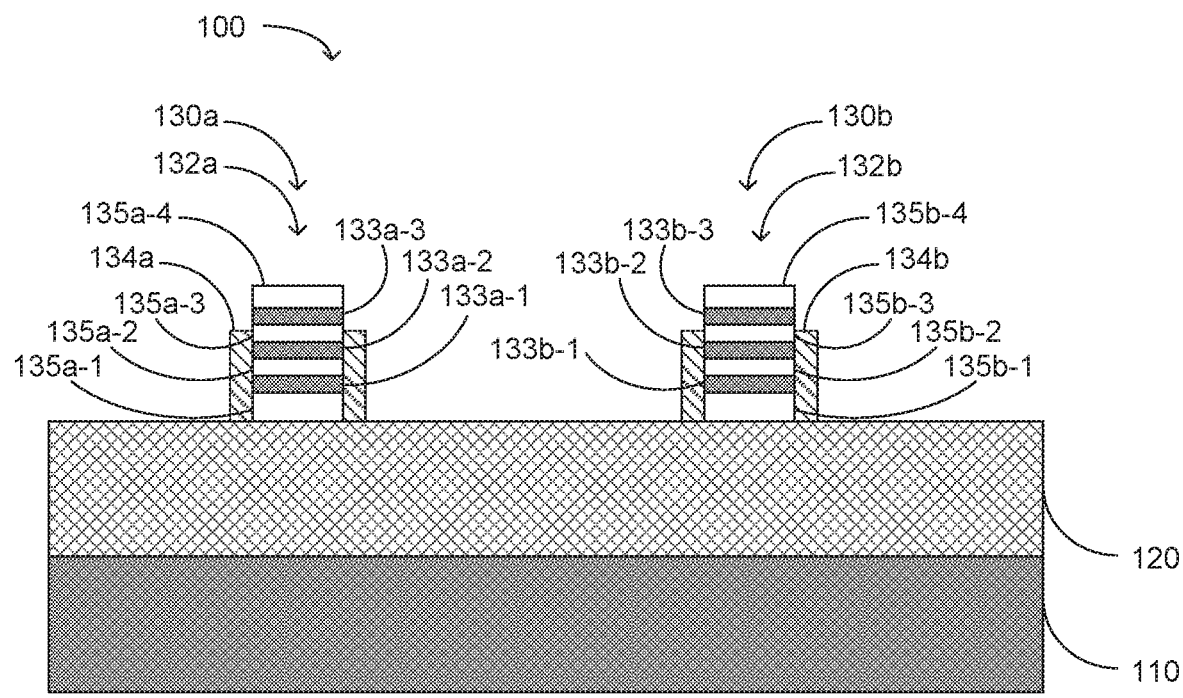
FIG. 2A illustrates an X-cut view of a semiconductor device after a first stage of processing, in accordance with embodiments herein.

FIGS. 2A-2O illustrate stylized cross-sectional depictions of the semiconductor device 100 under various stage of manufacture, in accordance with embodiments herein.

Figure 2B:
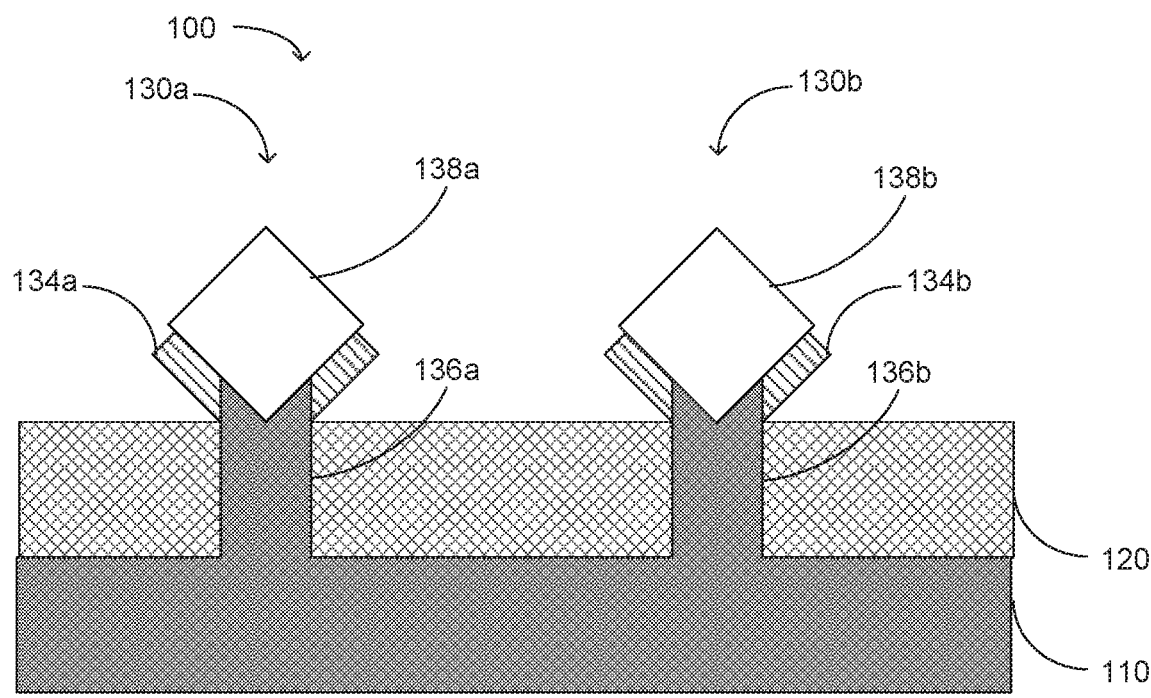
FIG. 2B illustrates an X-cut view of a semiconductor device after a first stage of processing, in accordance with other embodiments herein.
Figure 3:
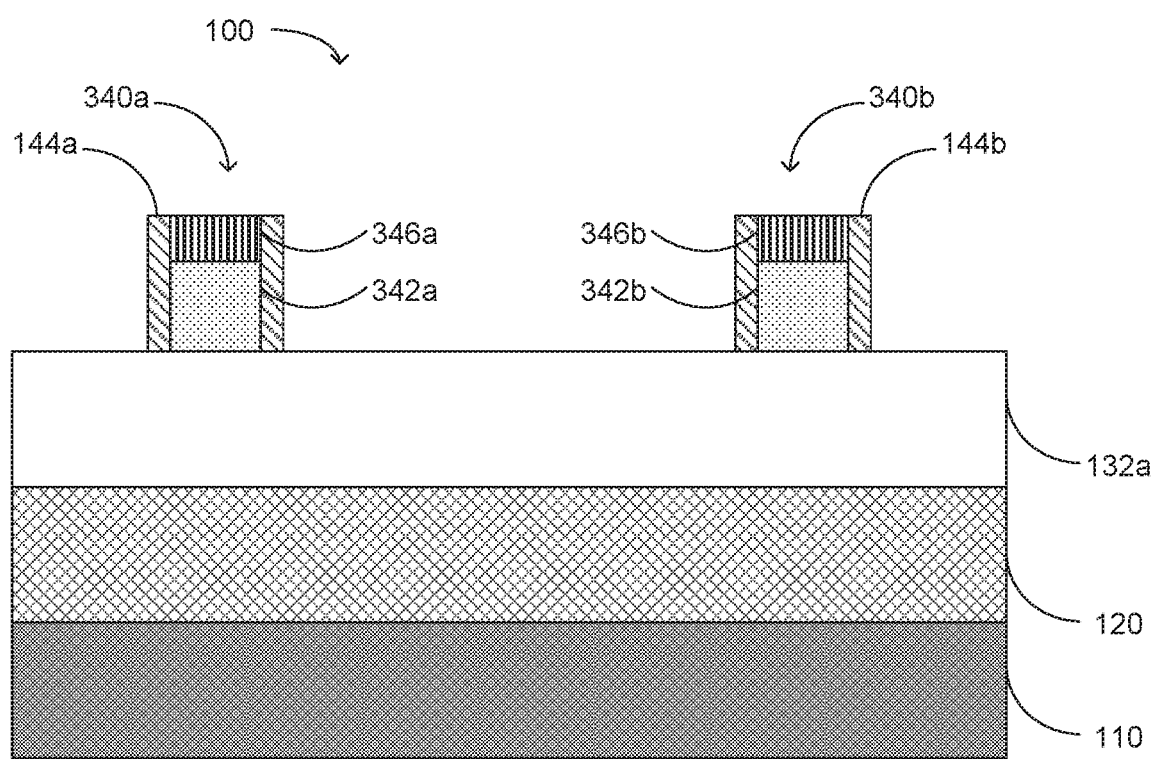
FIG. 3 illustrates a Y1-cut view of a semiconductor device after the first stage of processing, in accordance with embodiments herein.
Figure 4:
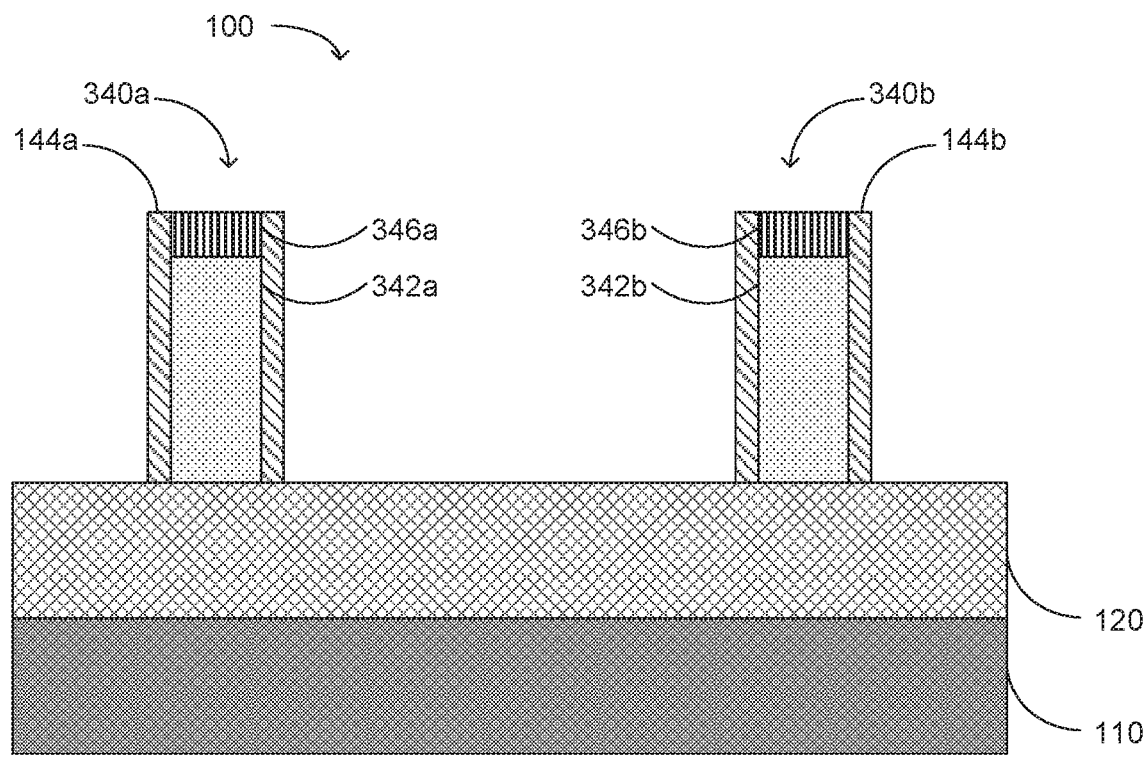
FIG. 4 illustrates a Y2-cut view of a semiconductor device after the first stage of processing, in accordance with embodiments herein.

FIG. 2A illustrates an X-cut view of the semiconductor device 100, FIG. 3 illustrates a Y1-cut view of the semiconductor device 100 after the first stage of processing, and FIG. 4 illustrates a Y2-cut view of the semiconductor device 100, after a first stage of processing, in accordance with embodiments herein. FIG. 2B illustrates an X-cut view of an alternative embodiment of the semiconductor device 100 after a first stage of processing.

In the first stage of processing, the isolation layer 120 is formed on a semiconductor substrate 110. The semiconductor substrate 110 may comprise any material known in the art as a substrate in a semiconductor device and is not crucial. In one embodiment, the semiconductor substrate 110 comprises silicon.

Also in the first stage of processing, the first and second active regions 130*a* and 130*b* are formed. In the embodiment depicted in FIG. 2A, forming the first and second active regions 130*a* and 130*b* comprises forming first and second nanosheet structures 132*a* and 132*b*. Each nanosheet structure 132*a*, 132*b* may comprise one or more first layers 133*a*-1 through 133*a*-3 or 133*b*-1 through 133*b*-3, and one or more second layers 135*a*-1 through 135*a*-4 or 135*b*-1 through 135*b*-4, wherein the first layers and the second layers are interspersed. Although the depicted embodiment shows (referring only to the first nanosheet structure 132*a* for brevity) three first layers 133*a*-1 through 133*a*-3, and four second layers 135*a*-1 through 135*a*-4, the person of ordinary skill in the art having the benefit of the present disclosure will through the exercise of routine skill be able to prepare a nanosheet structure 132 comprising one, two, three, four, five, etc. first layers 133 and one, two, three, four, five, etc. second layers 135.

Each of the first layers 133 may comprise any material and each of the second layers 135 may also comprise any material. In one embodiment, each of the first layers 133 may comprise a first material and each of the second layers 135 may comprise a second material. In one embodiment, the first material is silicon and the second material is silicon-germanium (SiGe) having a formula $Si_xGe_{1-x}$, wherein $0 \le x \le 1$.

The first layers 133 and the second layers 135 may be formed by any appropriate processes. The second layers 135 may be formed, for example, by various epitaxial growth processes such as ultra-high vacuum chemical vapor deposition (UHV-CVD), low-pressure CVD (LPCVD), reduced-pressure CVD (RPCVD), rapid thermal CVD (RTCVD) and molecular beam epitaxy (MBE). In one example, the CVD-based epitaxial growth may take place at a temperature of between about 400° C. to about 1100° C., while molecular beam epitaxy may use a lower temperature. In a specific example, wherein the second layers 135 comprise SiGe, selective epitaxial growth of SiGe may be performed using halogermanes and silanes as the source gases at temperatures around 600° C. Further, the first layers 133 and the second layers 135 may have any desired height.

Further information relating to nanosheet structures and the manufacture thereof may be found in U.S. Pat. No. 9,748,335, hereby incorporated herein by reference.

In some particular embodiments, wherein the first and second active elements are nanosheet structures 132*a* and 132*b*, no processing of the isolation layer 120 below the first and second active regions 130*a* and 130*b* may be required, though such processing is not excluded from the present disclosure. In the embodiment depicted in FIG. 2A, it can be seen that the nanosheet structures 132*a* and 132*b* are each at least partially above the isolation layer 120.

Turning to FIG. 2B, another particular embodiment is depicted, wherein the first and second active regions 130*a* and 130*b* comprise fins, each fin comprising a fin body 136*a* or 136*b* and epitaxial silicon or silicon-germanium structures 138*a* or 138*b* atop the corresponding fin body 136*a* or 136*b*. The fin body 136*a* or 136*b* may be formed in the semiconductor device 100, such as by patterning the semiconductor substrate 110 to yield fin bodies 136*a* and 136*b*, followed by deposition of the isolation layer 120 between and around fin bodies 136*a* and 136*b*. Epitaxial growth to form the first and second epitaxial structures 138*a* and 138*b* may then be performed using techniques familiar to the person of ordinary skill in the art.

In the depicted embodiment of FIG. 2B, electrical communication may be effected between the first epitaxial structure 138*a* and the semiconductor substrate 110 (and likewise between the second epitaxial structure 138*b* and the semiconductor substrate 110). Further, in the embodiment depicted in FIG. 2B, each of the first and second active regions 130*a* and 130*b* is at least partially above the isolation layer 120, e.g., the epitaxial structures 138 are each above the isolation layer 120.

The various stages of processing described below are applicable to both active regions 130 comprising nanosheet structures 132 and active regions 130 comprising epitaxial structures 138 atop fin bodies 136. For the sake of brevity, only embodiments relating to nanosheet structures 132*a* and 132*b* will be shown in FIGS. 3-20. Further, in FIGS. 3-20, first and second layers 133 and 135 will be omitted for brevity and the nanosheet structures 132*a* and 132*b* will be depicted as single drawing objects. The nanosheet structures 132*a* and 132*b* may be referred to herein as active elements 132*a* and 132*b*, but it must be borne in mind that the term "active elements" as used in the claims encompasses both nanosheet structures and fin structures such as those shown in FIG. 2B.

Subsequently in the first stage of processing, dummy gates 340*a* and 340*b* may be formed. The dummy gates 340*a* and 340*b* will be replaced by gate structures 140*a* and 140*b* at a later stage of processing. The dummy gates 340*a* and 340*b* each comprise a gate polycarbonate ("poly") structure 342*a* or 342*b*, and a dummy gate cap 346*a* or 346*b*.

Also in the first stage of processing, spacers 134*a* and 134*b* may be formed on lower portions of the sides of active elements 132*a* and 132*b* and spacers 144*a* and 144*b* may be formed on the sides of dummy gates 340*a* and 340*b*. The spacers 134*a*, 134*b*, 144*a*, and 144*b* may be formed by conformally depositing a spacer material over the isolation layer 120, the active elements 132*a* and 132*b*, and the dummy gates 340*a* and 340*b*, followed by a reactive ion etch (RIE) process to remove the spacer material from the isolation layer 120, the tops of the dummy gates 340*a* and 340*b*, and the tops and side of the active elements 132*a* and 132*b*.

In one embodiment, the spacer material may be silicon nitride.

Figure 5:
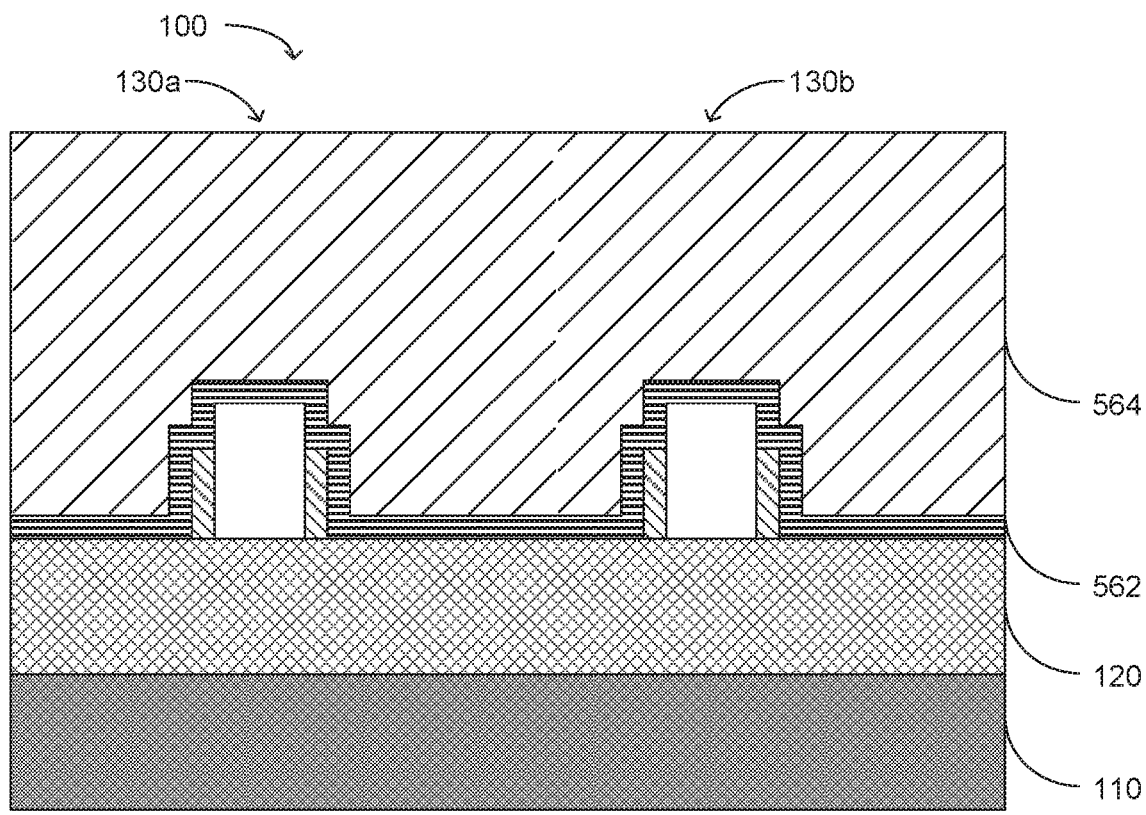
FIG. 5 illustrates an X-cut view of a semiconductor device after a second stage of processing, in accordance with embodiments herein.
Figure 6:
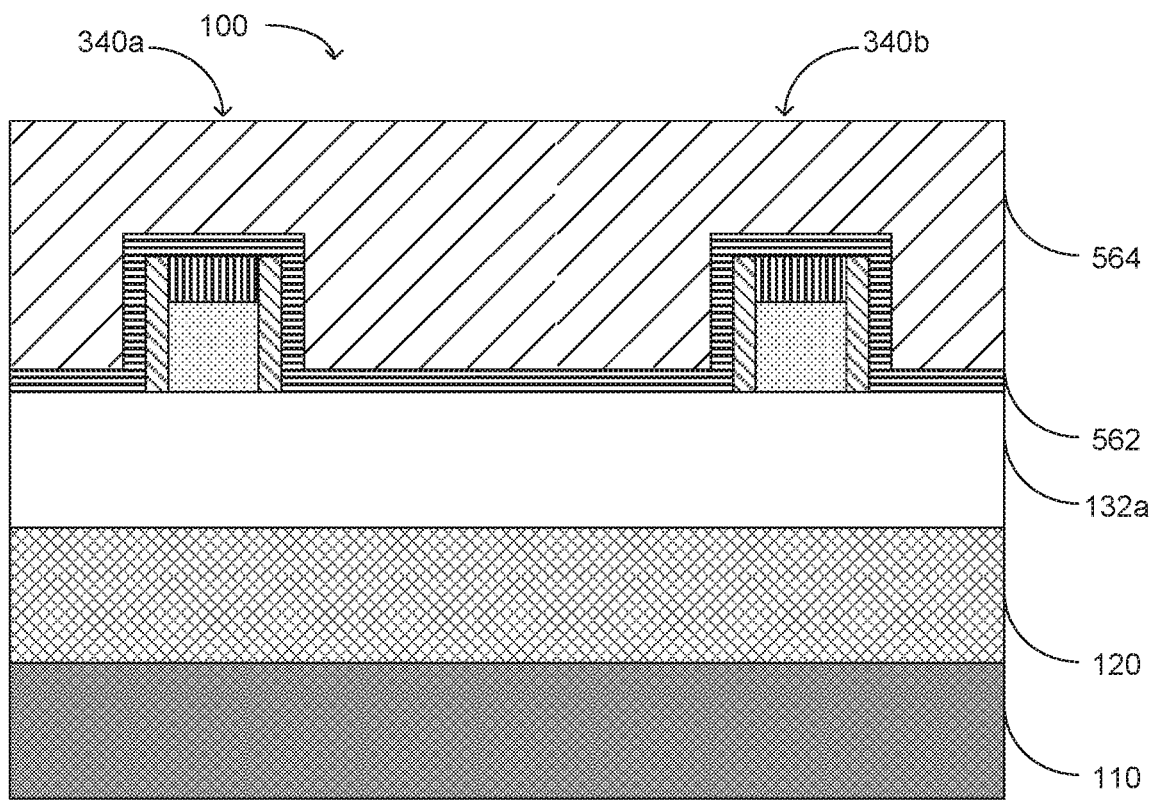
FIG. 6 illustrates a Y1-cut view of a semiconductor device after the second stage of processing, in accordance with embodiments herein.
Figure 7:
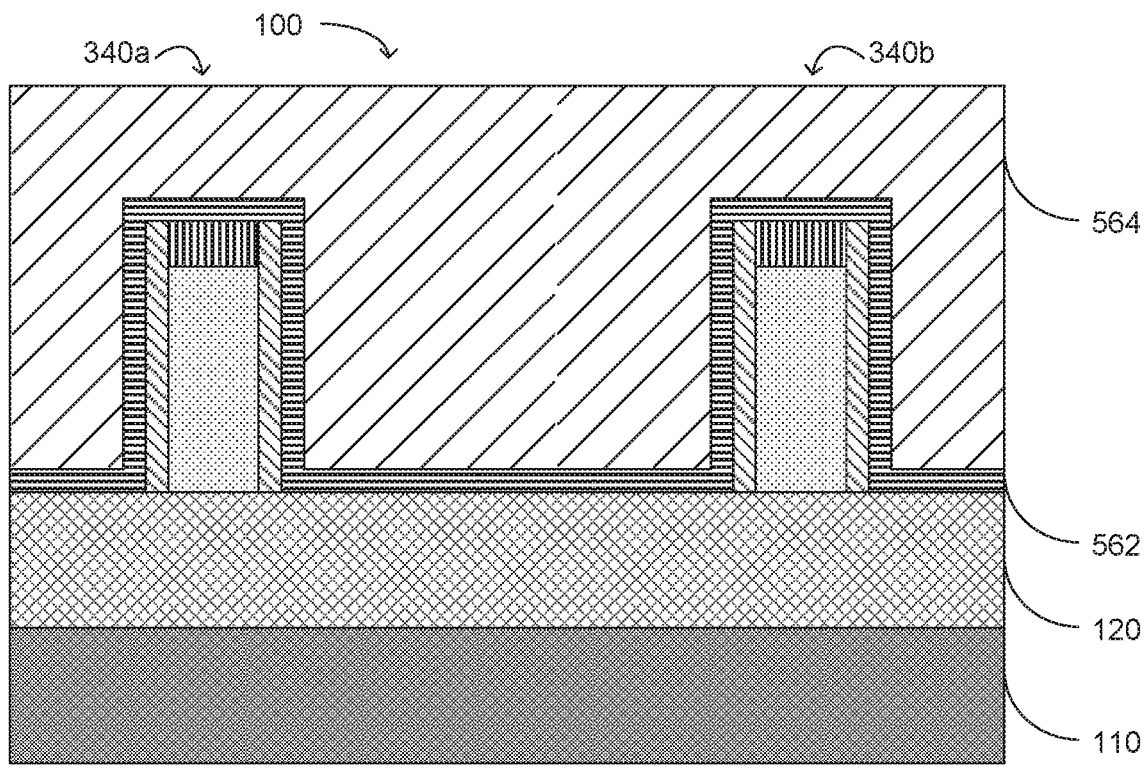
FIG. 7 illustrates a Y2-cut view of a semiconductor device after the second stage of processing, in accordance with embodiments herein.

FIG. 5 illustrates an X-cut view, FIG. 6 illustrates a Y1-cut view, and FIG. 7 illustrates a Y2-cut view of the semiconductor device 100 after a second stage of processing, in accordance with embodiments herein. In the second stage of processing, a high-κ dielectric layer 562 is formed, such as, in one embodiment, by conformally depositing over the isolation layer 120, the active regions 130*a* and 130*b*, and the dummy gates 340*a* and 340*b*. In one embodiment, the high-κ dielectric layer 562 may be selected from the group consisting of hafnium oxide (κ≈16-24) and aluminum oxide (κ≈9-12). The second stage of processing also involves the formation of an organic polymerization layer (OPL) 564 over the semiconductor device 100. Any OPL material known to the person of ordinary skill in the art may be used to form OPL 564.

Figure 8:
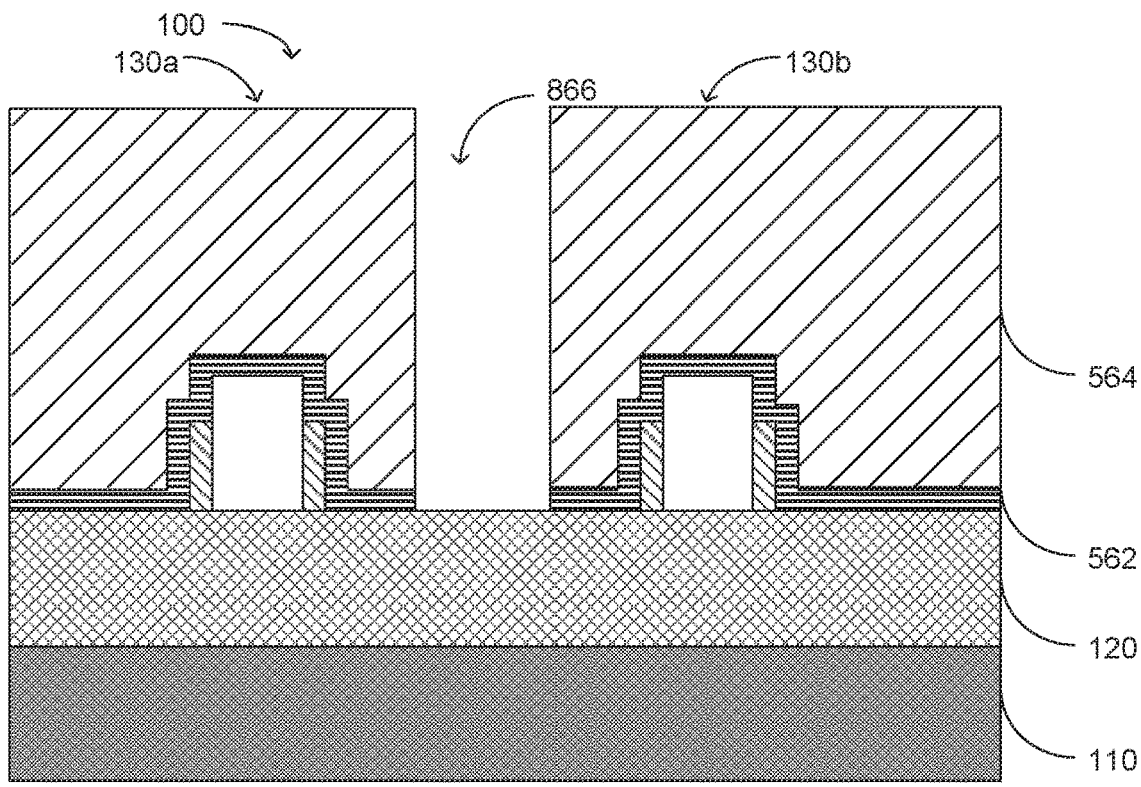
FIG. 8 illustrates an X-cut view of a semiconductor device after a third stage of processing, in accordance with embodiments herein.
Figure 9:
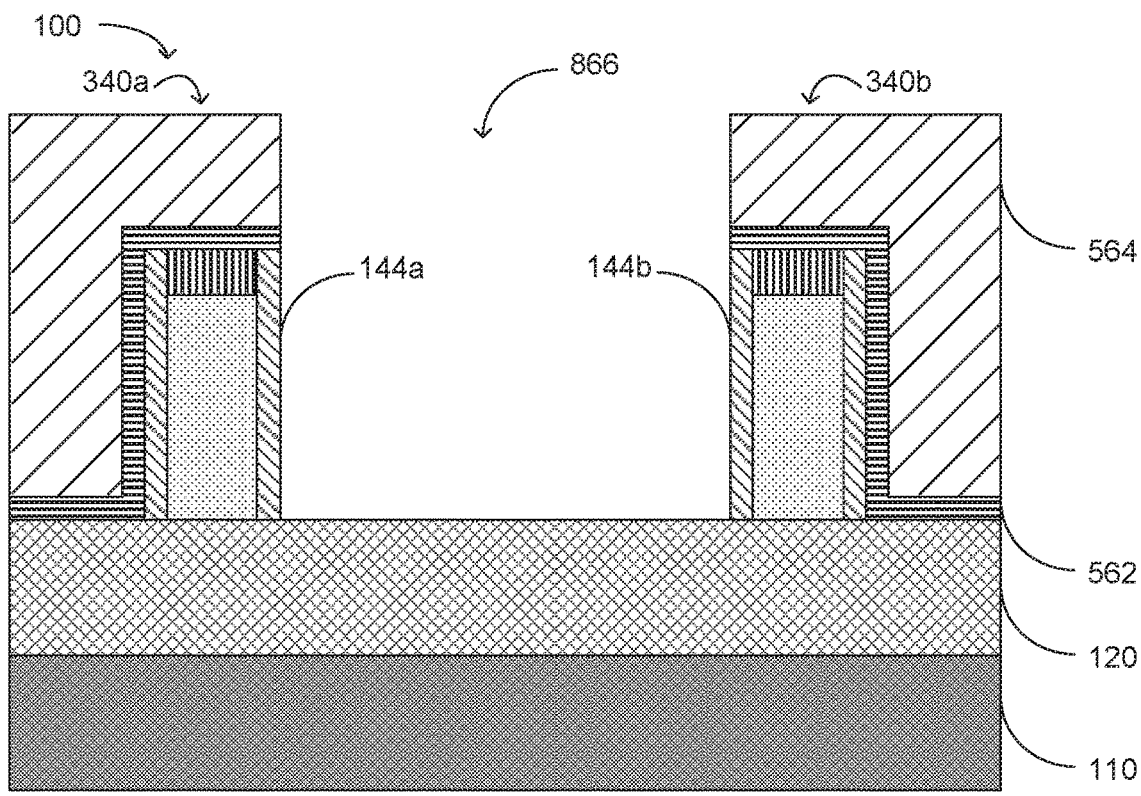
FIG. 9 illustrates a Y2-cut view of a semiconductor device after the third stage of processing, in accordance with embodiments herein.

FIG. 8 illustrates an X-cut view and FIG. 9 illustrates a Y2-cut view of the semiconductor device 100 after a third stage of processing, in accordance with embodiments herein. In the third stage of processing, a trench 866 is formed in the OPL 564 and high-κ dielectric layer 562. The trench 866 may be formed by known lithographic and RIE techniques that need not be described in detail. The trench 866 is formed between the active regions 130*a* and 130*b* and between the dummy gates 340*a* and 340*b*. The trench 866 exposes a rectangular portion of the isolation layer 120 on the bottom of the trench, and the spacers 144*a* and 144*b* on the facing sides of the dummy gates 340*a* and 340*b*.

Because the trench 866 is not formed between the dummy gates 340*a* and 340*b* in the area of the Y1-cut, the Y1-cut corresponding to the third through the seventh stages of processing will not be shown.

Figure 10:
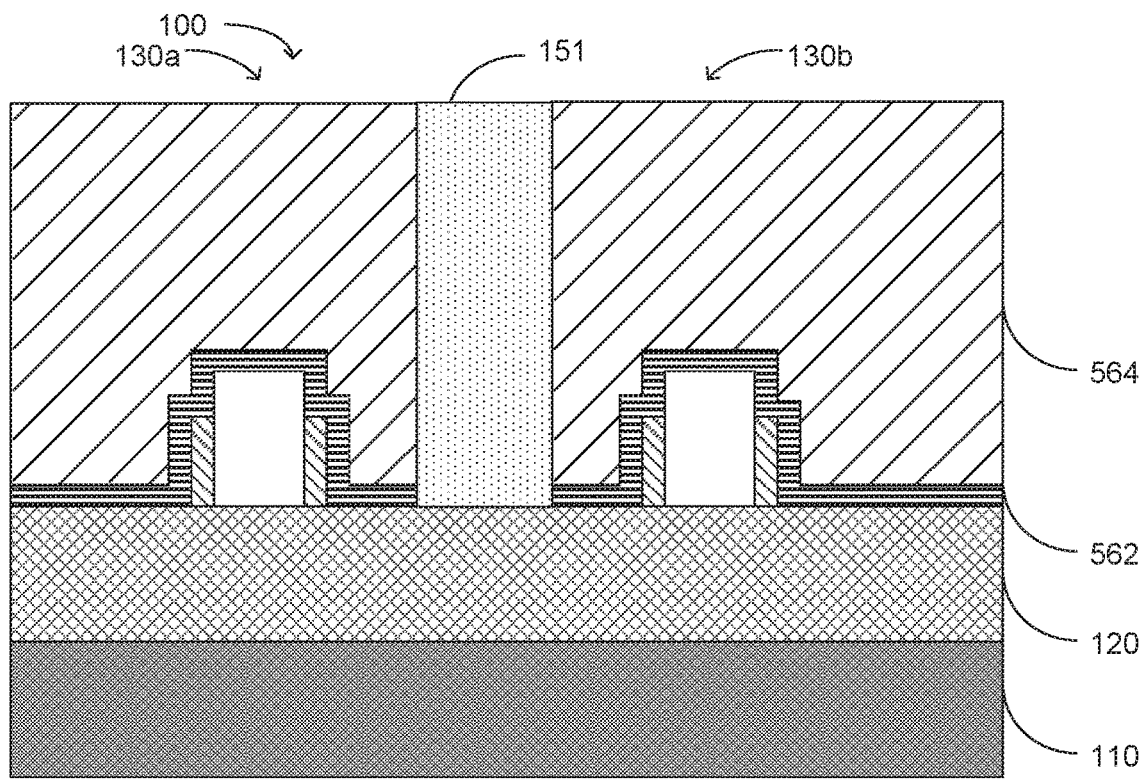
FIG. 10 illustrates an X-cut view of a semiconductor device after a fourth stage of processing, in accordance with embodiments herein.
Figure 11:
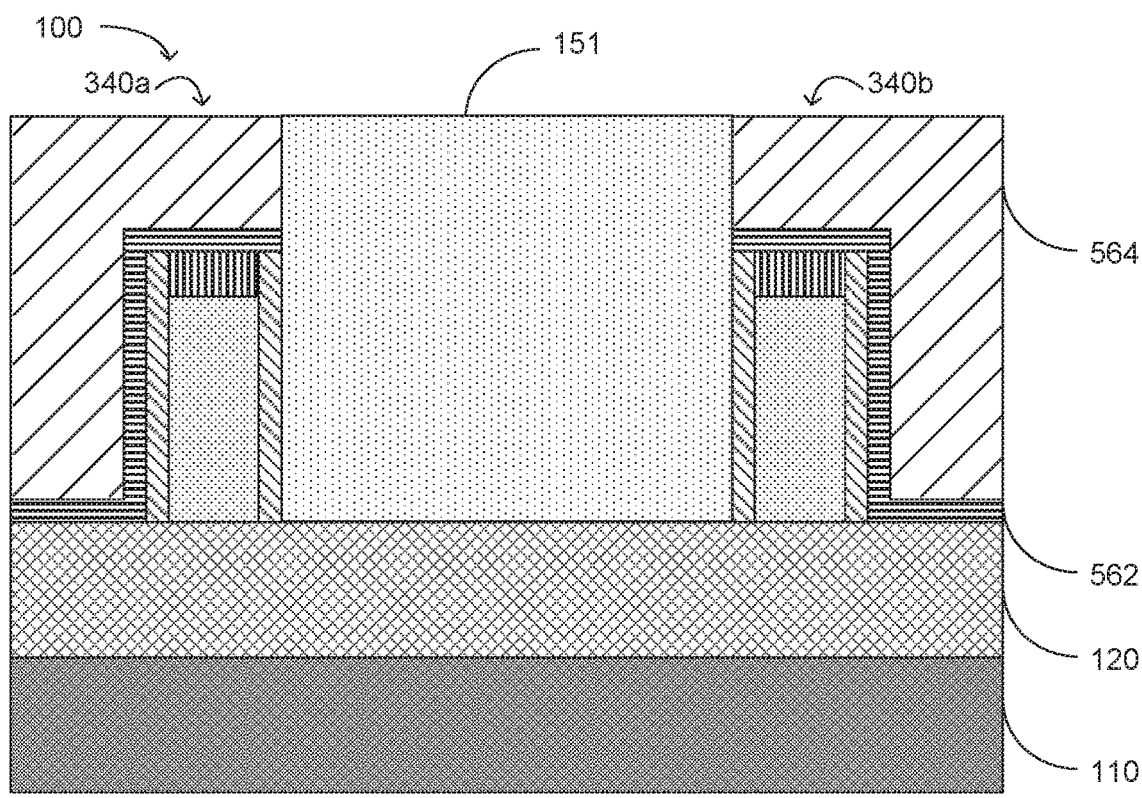
FIG. 11 illustrates a Y2-cut view of a semiconductor device after the fourth stage of processing, in accordance with embodiments herein.

FIG. 10 illustrates an X-cut view and FIG. 11 illustrates a Y2-cut view of the semiconductor device 100 after a fourth stage of processing, in accordance with embodiments herein. In the fourth stage of processing, the trench 866 is filled with an isolation pillar material 151. In one embodiment, the isolation pillar material 151 is silicon nitride. In other embodiments, other isolation pillar materials 151 may be used. Filling the trench 866 with the isolation pillar material 151 may comprise overfilling the trench 866 and planarizing, such as by chemical-mechanical polishing (CMP), the isolation pillar material 151 to have a top substantially coplanar with the top of the OPL 564.

After the fourth stage of processing, the isolation pillar material 151 contacts the isolation layer 120 on the bottom of the former trench 866, contacts the dummy gates 340*a* and 340*b* on two sides of the former trench 866 (as shown in FIG. 11), and contacts the high-κ dielectric layer 562 on lower portions of the other two sides of the former trench 866 (as shown in FIG. 10).

Figure 12:
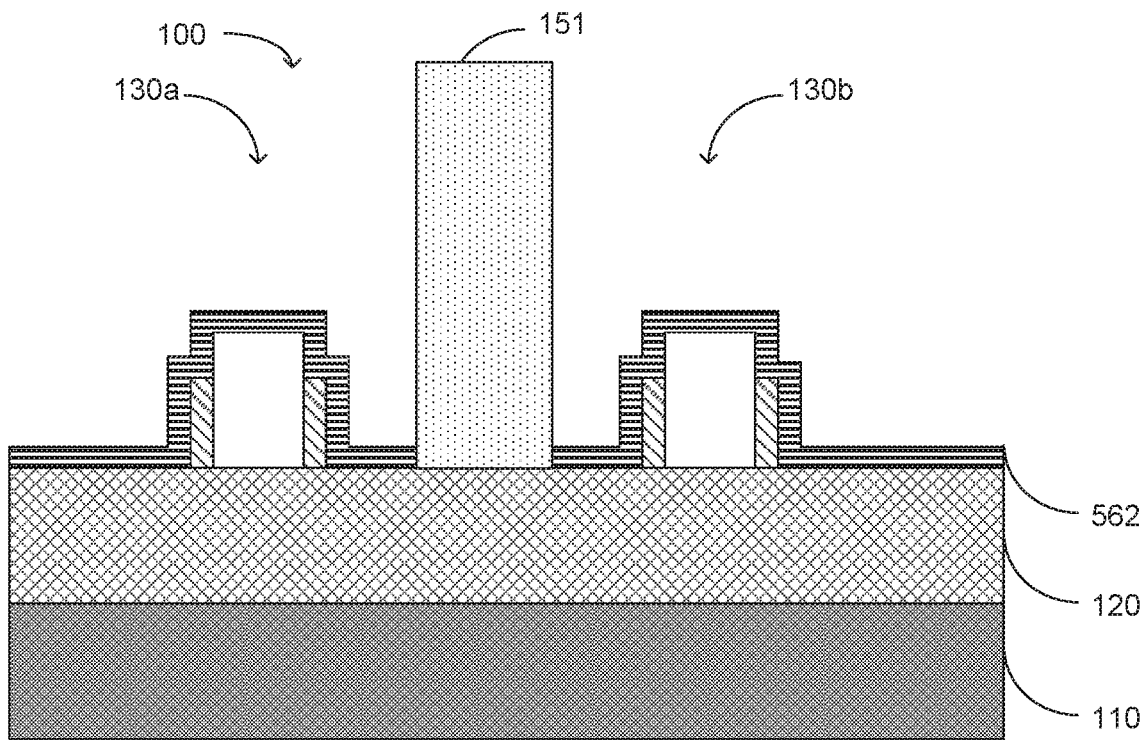
FIG. 12 illustrates an X-cut view of a semiconductor device after a fifth stage of processing, in accordance with embodiments herein.
Figure 13:
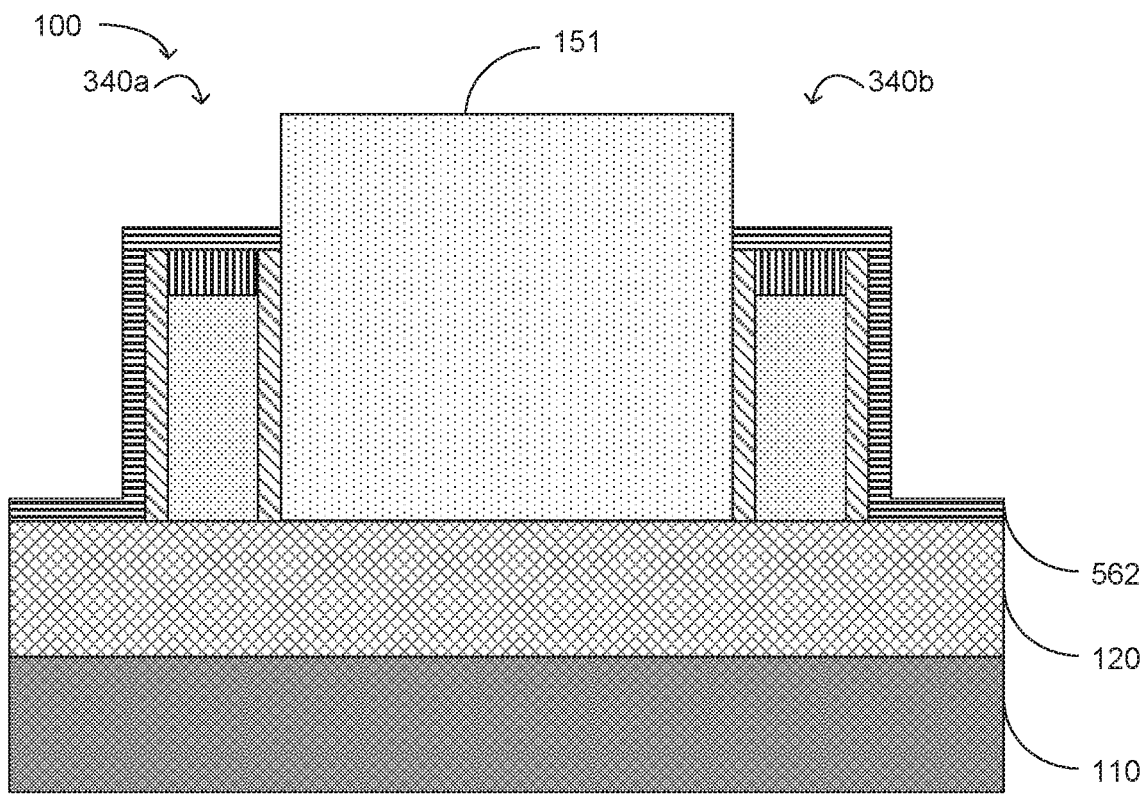
FIG. 13 illustrates a Y2-cut view of a semiconductor device after the fifth stage of processing, in accordance with embodiments herein.

FIG. 12 illustrates an X-cut view and FIG. 13 illustrates a Y2-cut view of the semiconductor device 100 after a fifth stage of processing, in accordance with embodiments herein. In the fifth stage of processing, the OPL 564 is removed, such as by ashing or other known technique. The fifth stage of processing exposes the isolation pillar material 151 between the active regions 130*a* and 130*b* and between and in contact with the dummy gates 340*a* and 340*b*. The isolation pillar material 151 is higher than the active regions 130*a* and 130*b* and the dummy gates 340*a* and 340*b*.

Figure 14:
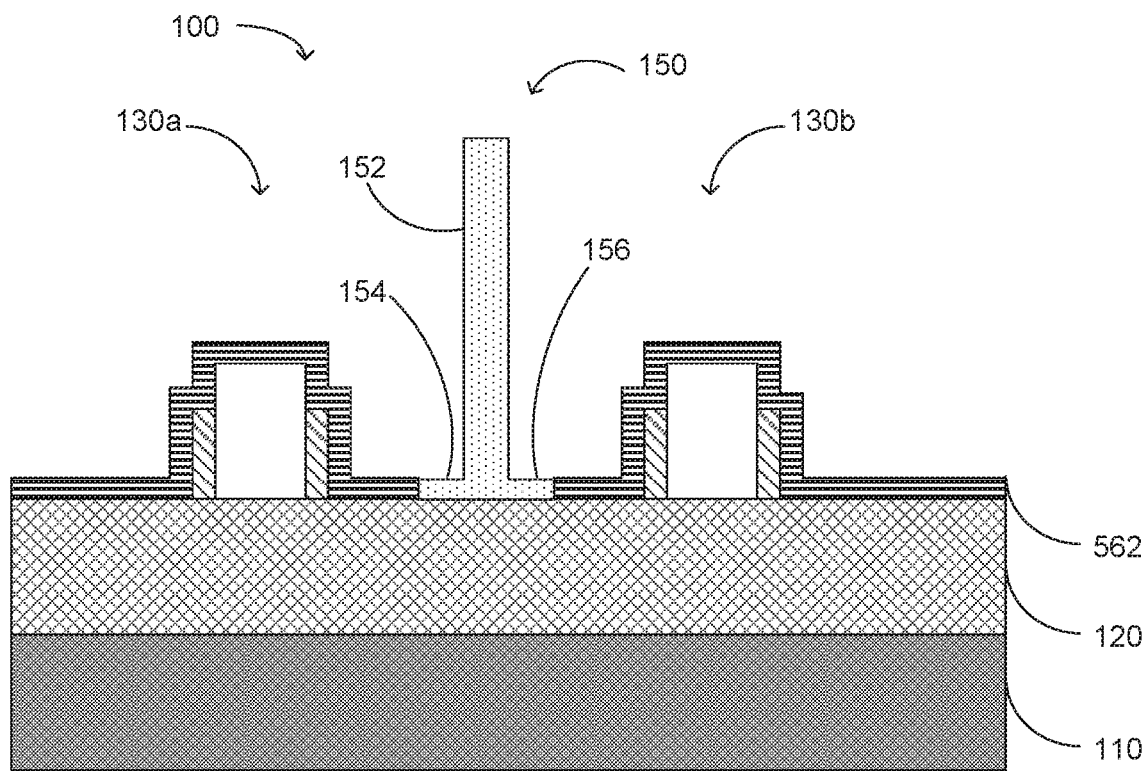
FIG. 14 illustrates an X-cut view of a semiconductor device after a sixth stage of processing, in accordance with embodiments herein.
Figure 15:
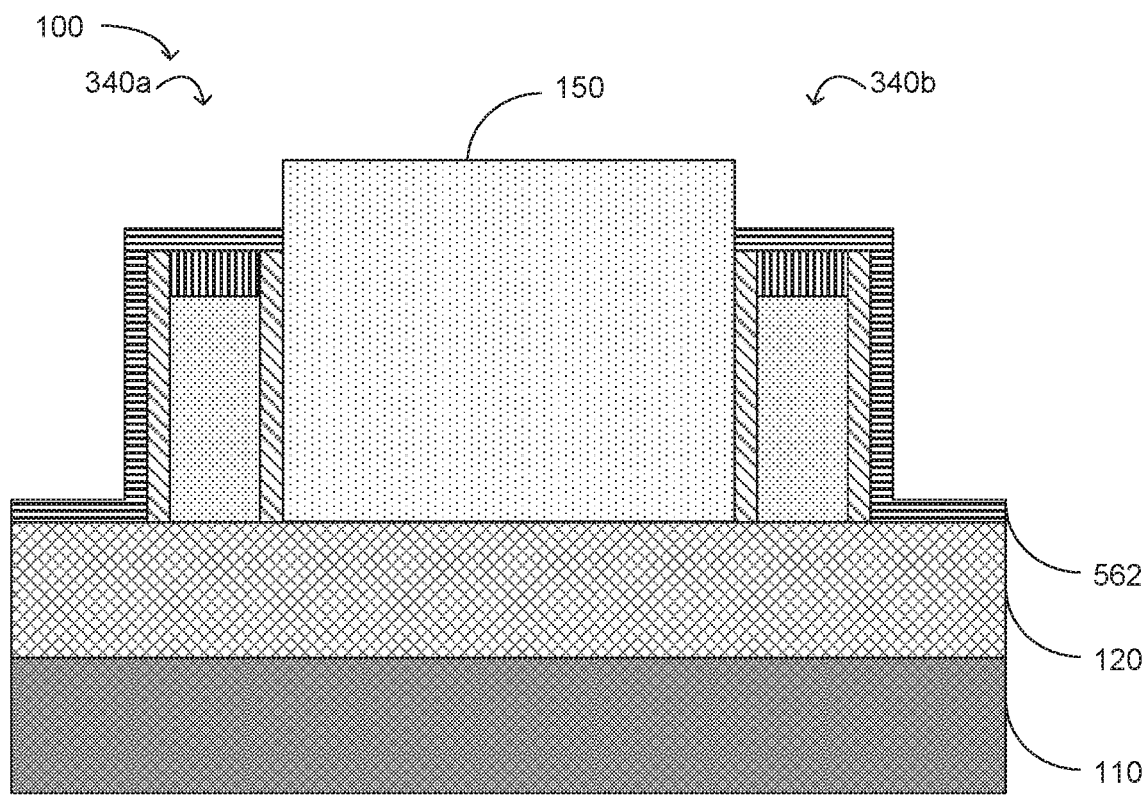
FIG. 15 illustrates a Y2-cut view of a semiconductor device after the sixth stage of processing, in accordance with embodiments herein.

FIG. 14 illustrates an X-cut view and FIG. 15 illustrates a Y2-cut view of a semiconductor device after the sixth stage of processing, in accordance with embodiments herein. In the sixth stage of processing, the isolation pillar material 151 is trimmed, such as by known plasma-directed removal techniques. Trimming the isolation pillar material 151 reduces the width and may reduce the height of the isolation pillar material 151, thereby yielding the isolation pillar 150. The high-κ dielectric layer 562 protects the lower portions of two sides of the isolation pillar material 151, which imparts an inverted-T shape to the isolation pillar 150. Specifically, and as alluded to above, the isolation pillar 150 as seen in the X-cut view comprises an upright central portion 152, a first foot 154, and a second foot 156.

Figure 16:
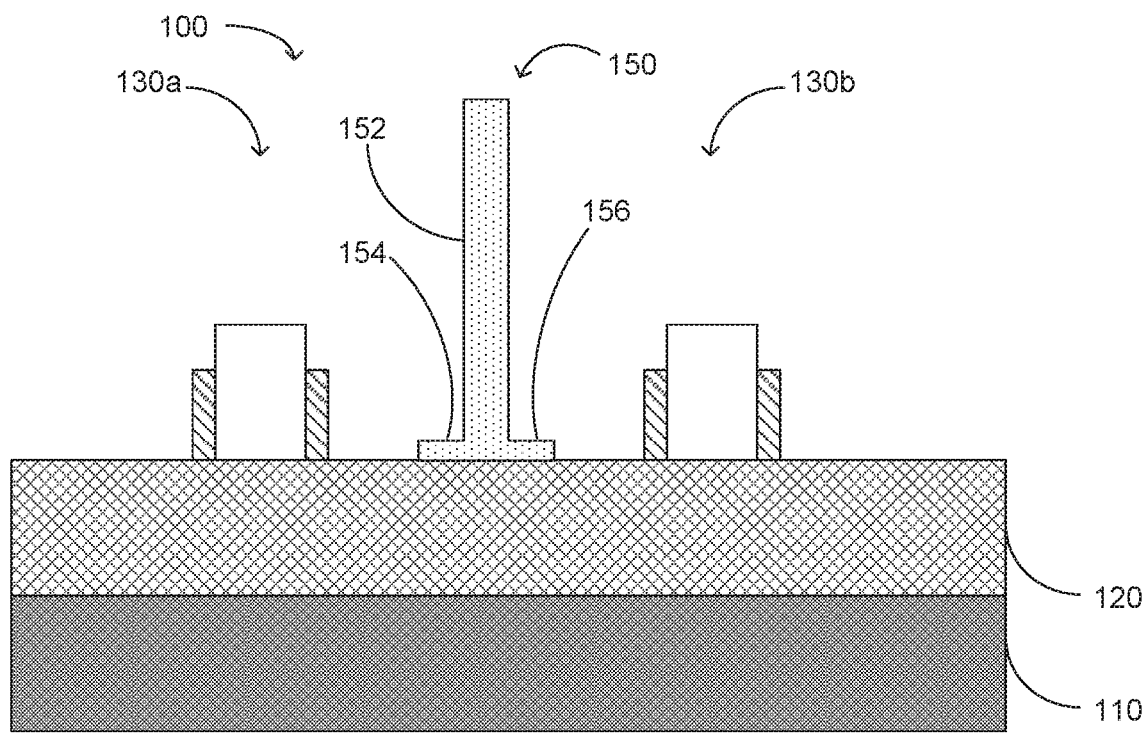
FIG. 16 illustrates an X-cut view of a semiconductor device after a seventh stage of processing, in accordance with embodiments herein.
Figure 17:
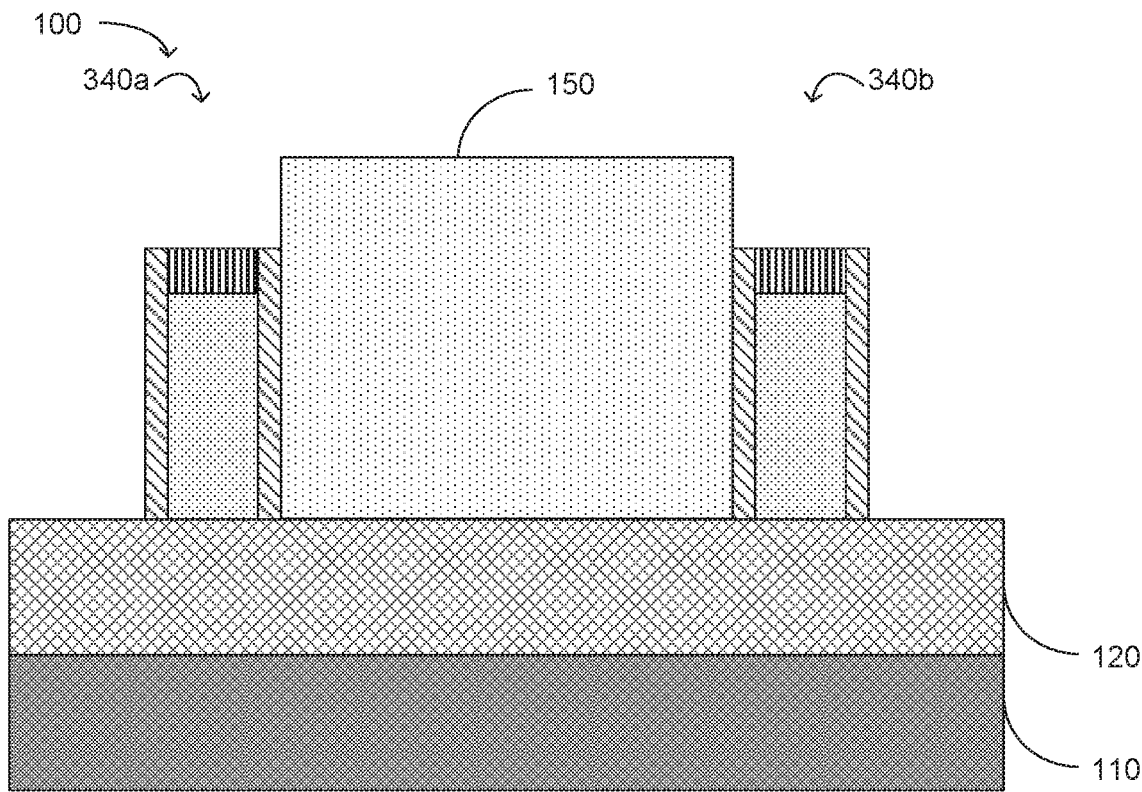
FIG. 17 illustrates a Y2-cut view of a semiconductor device after the seventh stage of processing, in accordance with embodiments herein.

FIG. 16 illustrates an X-cut view and FIG. 17 illustrates a Y2-cut view of the semiconductor device 100 after a seventh stage of processing, in accordance with embodiments herein. In the seventh stage of processing, the high-κ dielectric layer 562 is removed, such as by any known technique, thereby exposing the sides of the first foot 154 and the second foot 156 of the isolation pillar 150.

Figure 18:
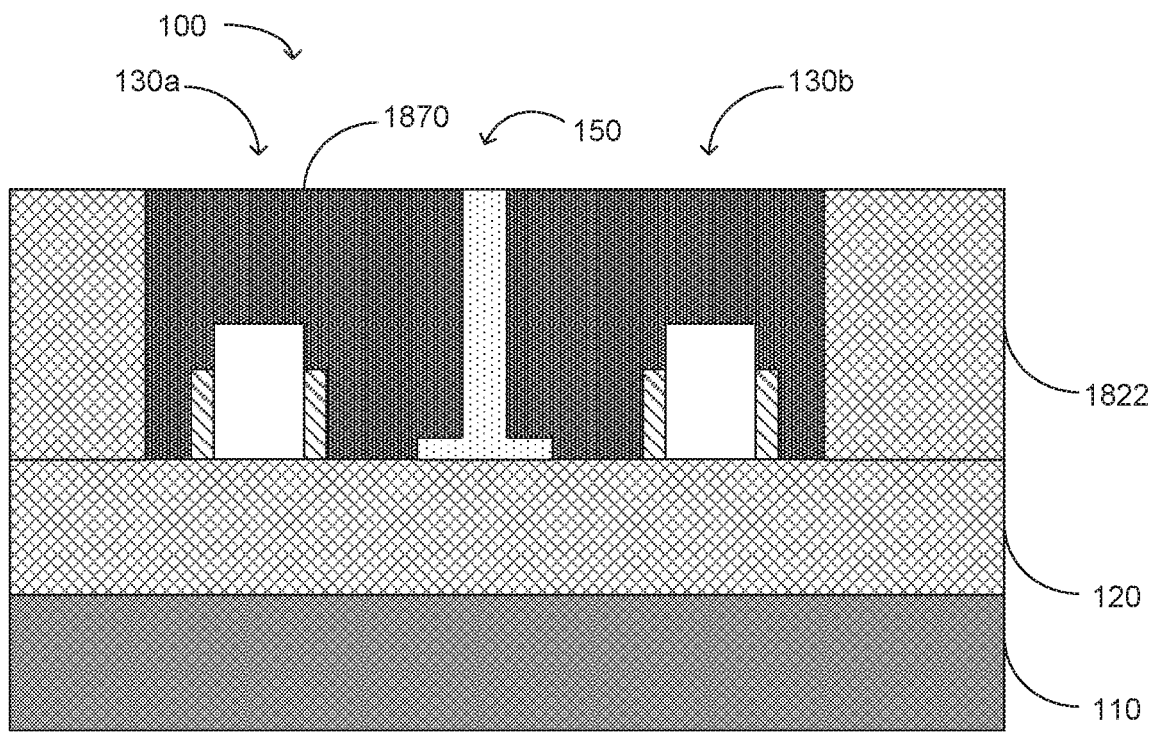
FIG. 18 illustrates an X-cut view of a semiconductor device after an eighth stage of processing, in accordance with embodiments herein.
Figure 19:
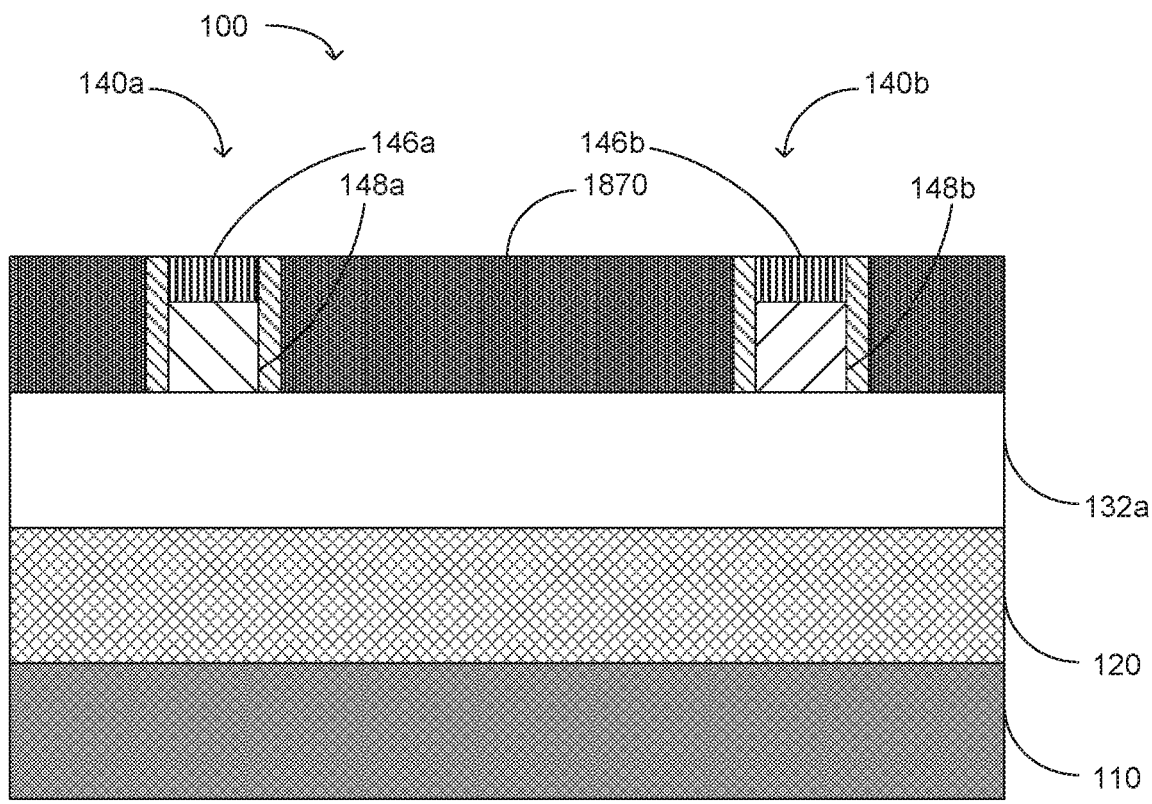
FIG. 19 illustrates a Y1-cut view of a semiconductor device after the eighth stage of processing, in accordance with embodiments herein.
Figure 20:
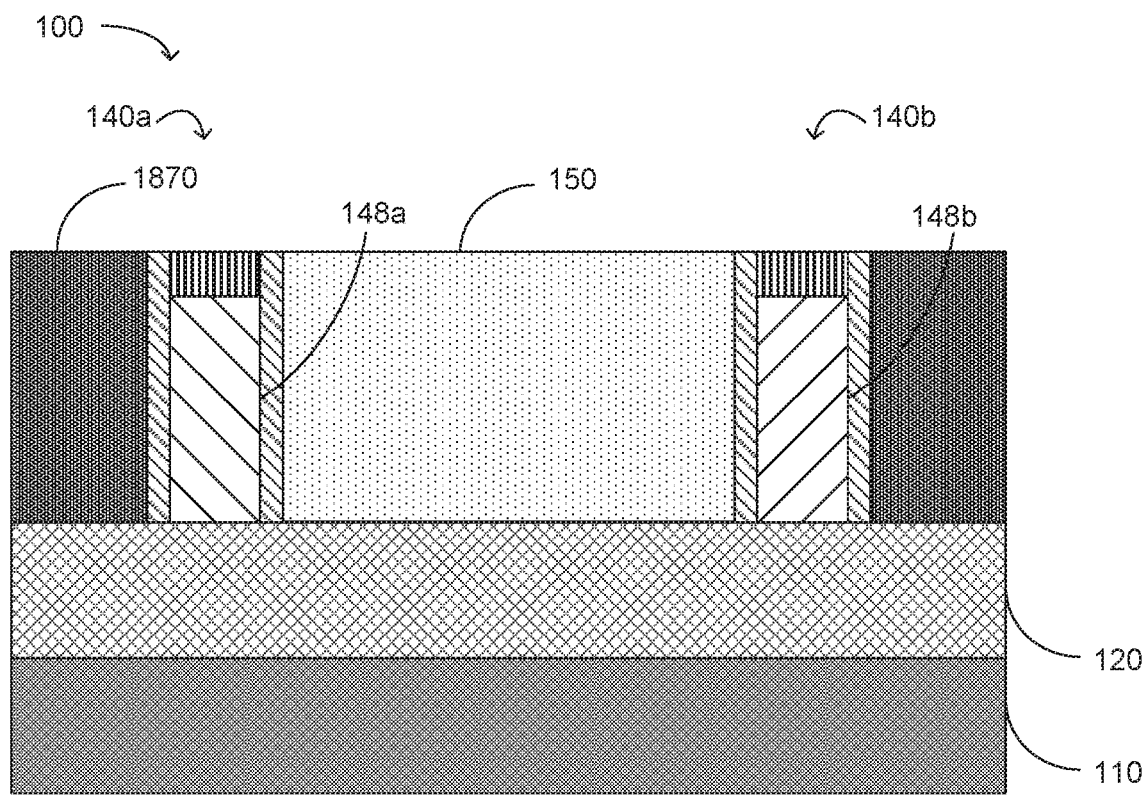
FIG. 20 illustrates a Y2-cut view of a semiconductor device after the eighth stage of processing, in accordance with embodiments herein.

FIG. 18 illustrates an X-cut view, FIG. 19 illustrates a Y1-cut view, and FIG. 20 illustrates a Y2-cut view of the semiconductor device 100 after an eighth stage of processing, in accordance with embodiments herein. In the eighth stage of processing, a replacement metal gate (RMG) process may be performed. RMG processes are well-known in the art. Generally, in an RMG process, a dummy material (e.g. dummy gates 340a and 340b) used for various processing steps is removed and a gate electrode material formed in its place. For example, an RMG process of the eighth stage of processing may involve removal of the dummy gates 340a and 340b, by techniques known to the person of ordinary skill in the art having the benefit of the present disclosure. Removal of the dummy gate 340a or 340b forms openings where the gate stacks of transistors 140a and 140b, respectively, will be formed. In the openings may be formed a gate dielectric layer, a work function metal (WFM) layer, a metal gate electrode 148a or 148b, and/or a capping layer 146a or 146b. (The gate dielectric layer disposed under the metal gate electrode 148a or 148b and above the active elements 132a (or 132b, not shown) and the isolation layer 120 is omitted for the sake of brevity from the drawings. Also omitted for the sake of brevity are work function metal layers, which the person of ordinary skill in the art will be aware may enhance the usability of a PFET or NFET device comprising the gate structure 140a or 140b.

The eighth stage of processing may also involve forming an oxide layer 1822 and/or contacts 1870. For example, an oxide material may be formed and planarized to the top of the isolation pillar 150, then subjected to an RIE process to yield the oxide layer 1822 as shown, and a contact trench that is subsequently filled with a contact metal, to form contacts 1870. Any appropriate metal, such as tungsten, may be used as the contact metal in contacts 1870.

Additional processing steps that will be known to the person of ordinary skill in the art can be performed to render the semiconductor device 100 suitable for one or more desired applications.

Figure 21:
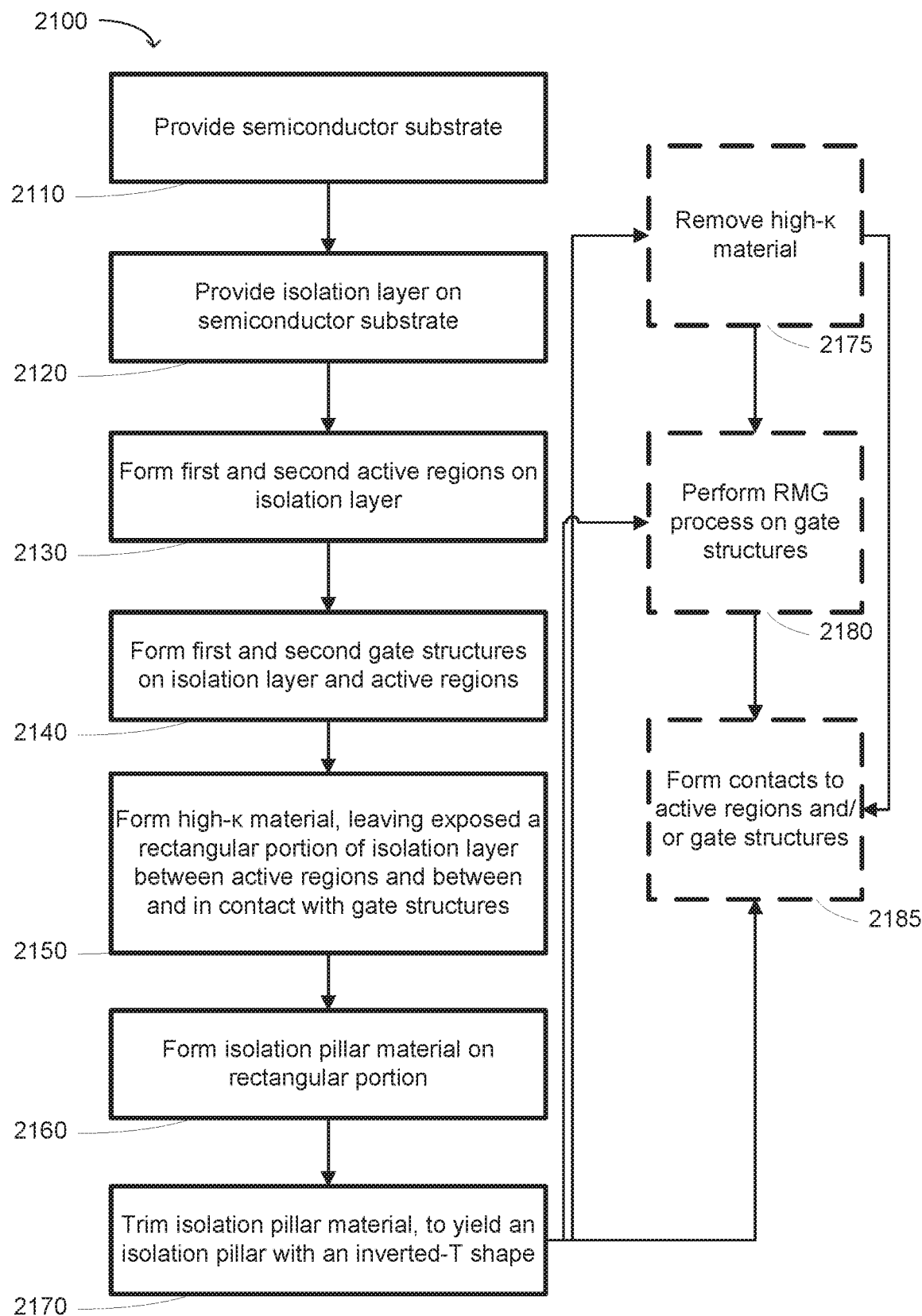
FIG. 21 illustrates a flowchart of a method, in accordance with embodiments herein.

FIG. 21 provides a flowchart of a method 2100, in accordance with embodiments herein. As depicted, the method 2100 comprises providing (at 2110) a semiconductor substrate. The semiconductor substrate may be as described above regarding the semiconductor substrate 110. In one embodiment, providing the semiconductor substrate comprises structuring a silicon material, e.g., patterning bulk silicon, forming a multi-layer substrate comprising a silicon layer, or the like, as will be known to the person of ordinary skill in the art.

The method 2100 also comprises providing (at 2120) an isolation layer disposed on the semiconductor substrate. The isolation layer may be as described above regarding the isolation layer 120. In one embodiment, the isolation layer comprises silicon oxide.

The method 2100 further comprises forming (at 2130) a first active region and a second active region disposed at least partially above the isolation layer, wherein the first active region and the second active region each comprise a long axis and a short axis, wherein the long axes of the first and second active regions are substantially parallel and extend in a first direction. The first and second active regions may be as described above regarding the first and second active regions 130a and 130b. In one embodiment, forming (at 2130) the first active region and the second active region comprises forming nanosheet structures. In an alternative embodiment, forming (at 2130) comprises forming a fin structure.

Further, the method 2100 comprises forming (at 2140) a first gate structure and a second gate structure disposed on the isolation layer, the first active region, and the second active region, wherein the first gate structure and the second gate structure each comprise a long axis and a short axis, wherein the long axes of the first and second gate structures are substantially parallel and extend in a second direction, wherein the second direction is substantially perpendicular to the first direction. The first and second gate structures may be as described above regarding the gate structures 140a and 140b. In one embodiment, forming (at 2140) comprises forming a gate poly layer; a capping layer disposed on the gate poly layer; and a spacer disposed on sides of the gate poly layer and sides of the capping layer. In other words, forming (at 2140) may involve forming dummy gates.

Forming (at 2110, 2120, 2130, and 2140) may be performed using known techniques, as described above.

The method 2100 also comprises forming (at 2150) a high-κ material on the isolation layer, the first active region, the second active region, the first gate structure, and the second gate structure, such that a rectangular portion of the isolation layer between the first active region and the second active region, and between and in contact with the first gate structure and the second gate structure, remains exposed. The high-κ material may be as described above regarding the high-κ material 562. In one embodiment, the high-κ material is selected from the group consisting of hafnium oxide and aluminum oxide. Forming (at 2150) may be performed using known techniques, as described above.

The method 2100 additionally comprises forming (at 2160) an isolation pillar material on the rectangular portion of the isolation layer, wherein the isolation pillar material has a rectangular shape in a sectional view taken across the first direction and lower portions of two opposed sides of the isolation pillar material is in contact with the high-κ material. The isolation pillar material may be as described above regarding the isolation pillar material 151. In one embodiment, the isolation pillar material comprises silicon nitride. Forming (at 2160) may be performed using known techniques, as described above.

The method 2100 further comprises trimming (at 2170) upper portions of the two opposed sides of the isolation pillar material, wherein the upper portions are above the lower portions, to yield an isolation pillar disposed on the isolation layer, between the first and second active regions, and between and in contact with the first and second gate structures, wherein the isolation pillar has an inverted-T shape in a sectional view taken across the first direction. The isolation pillar may be as described above regarding the isolation pillar 150. Trimming (at 2170) may be performed using known techniques, as described above.

In one embodiment, the method 2100 may further comprise removing (at 2175) the high-κ material from the isolation layer, the first active region, the second active region, the first gate structure, and the second gate structure. Removing (at 2175) may be performed using known techniques, as described above.

Alternatively or in addition, in one embodiment, the method 2100 may additionally comprise performing (at 2180) a replacement metal gate (RMG) process on the first gate structure and the second gate structure. Performing (at 2180) the RMG process may be performed using known techniques, as described above.

Alternatively or in addition, in yet another embodiment, the method 2100 may further comprise forming (at 2185) one or more contacts to at least one of the first active region, the second active region, the first gate structure, or the second gate structure. Forming (at 2185) may be performed using known techniques, as described above.

Figure 22:
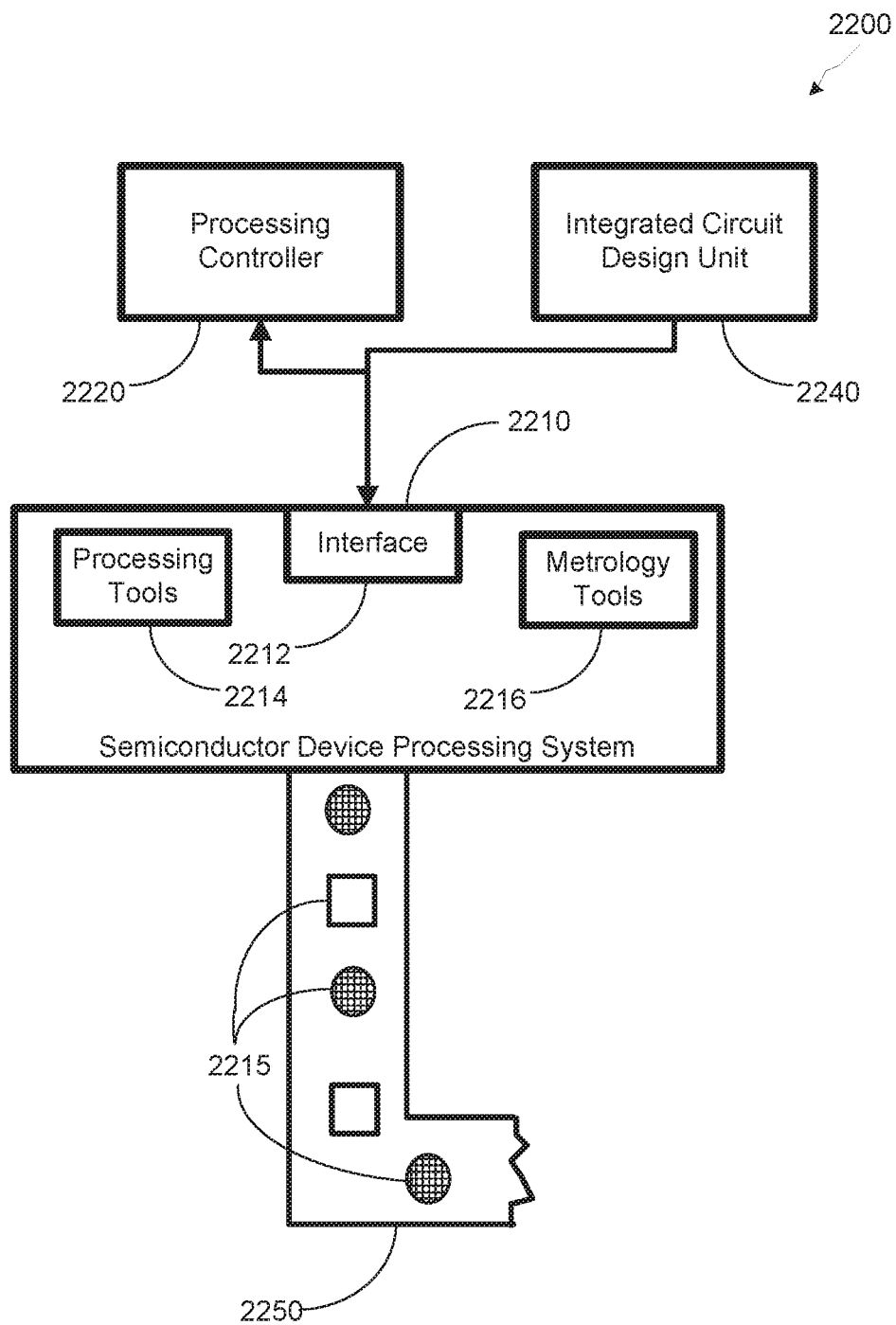
FIG. 22 illustrates a stylized depiction of a system for fabricating a semiconductor device, in accordance with embodiments herein.

Turning now to FIG. 22, a stylized depiction of a system 2200 for fabricating a semiconductor device, in accordance with embodiments herein, is illustrated. A system 2200 of FIG. 22 may comprise a semiconductor device processing system 2210 and an integrated circuit design unit 2240. The semiconductor device processing system 2210 may manufacture integrated circuit devices based upon one or more designs provided by the integrated circuit design unit 2240.

The semiconductor device processing system 2210 may comprise various processing stations, such as etch process stations, photolithography process stations, CMP process stations, etc. Each of the processing stations may comprise one or more processing tools 2214 and or metrology tools 2216. Feedback based on data from the metrology tools 2216 may be used to modify one or more process parameters used by the processing tools 2214 for performing process steps.

The semiconductor device processing system 2210 may also comprise an interface 2212 that is capable of providing communications between the processing tools 2214, the metrology tools 2216, and a controller, such as the processing controller 2220. One or more of the processing steps performed by the semiconductor device processing system 2210 may be controlled by the processing controller 2220. The processing controller 2220 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 2210 may produce integrated circuits on a medium, such as silicon wafers. More particularly, the semiconductor device processing system 2210 may produce integrated circuits comprising a semiconductor device 100.

The production of integrated circuits by the semiconductor device processing system 2210 may be based upon the circuit designs provided by the integrated circuit design unit 2240. The semiconductor device processing system 2210 may provide processed integrated circuits/devices 2215 on a transport mechanism 2250, such as a conveyor system. In some embodiments, the conveyor system may be sophisticated clean room transport systems that are capable of transporting semiconductor wafers.

In some embodiments, the items labeled "2215" may represent individual wafers, and in other embodiments, the items 2215 may represent a group of semiconductor wafers, e.g., a "lot" of semiconductor wafers. The integrated circuit or device 2215 may comprise a transistor, a capacitor, a resistor, a memory cell, a processor, and/or the like.

The integrated circuit design unit 2240 of the system 2200 is capable of providing a circuit design that may be manufactured by the semiconductor device processing system 2210. The integrated circuit design unit 2240 may be capable of determining the number of devices (e.g., processors, memory devices, etc.) to place in a device package. Based upon such details of the devices, the integrated circuit design unit 2240 may determine specifications of the devices that are to be manufactured. Based upon these specifications, the integrated circuit design unit 2240 may provide data for manufacturing a semiconductor device package described herein.

The system 2200 may be capable of performing analysis and manufacturing of various products involving various technologies. For example, the system 2200 may receive design and production data for manufacturing devices of CMOS technology, Flash technology, BiCMOS technology, power devices, memory devices (e.g., DRAM devices), NAND memory devices, and/or various other semiconductor technologies. This data may be used by the system 2200 to fabricate semiconductor devices described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
   a semiconductor substrate;
   an isolation layer disposed on the semiconductor substrate;
   a first active region and a second active region disposed at least partially above the isolation layer, wherein the first active region and the second active region each comprise a long axis and a short axis, wherein the long axes of the first and second active regions are substantially parallel and extend in a first direction;
   a first gate structure and a second gate structure disposed on the isolation layer, the first active region, and the second active region, wherein the first gate structure and the second gate structure each comprise a long axis and a short axis, wherein the long axes of the first and second gate structures are substantially parallel and extend in a second direction, wherein the second direction is substantially perpendicular to the first direction; and
   an isolation structure disposed on the isolation layer, between the first and second active regions, and between and in contact with the first and second gate structures, wherein the isolation structure has an inverted-T shape in a sectional view taken across the first direction.

2. The semiconductor device of claim 1, wherein the isolation structure comprises silicon nitride.

3. The semiconductor device of claim 1, wherein the semiconductor substrate comprises silicon.

4. The semiconductor device of claim 1, wherein the isolation layer comprises silicon oxide.

5. The semiconductor device of claim 1, wherein the first active region and the second active region are each a nanosheet structure.

6. The semiconductor device of claim 1, wherein the first active region and the second active region are each a component of a fin structure.

7. A method, comprising:
   providing a semiconductor substrate;
   providing an isolation layer disposed on the semiconductor substrate;
   forming a first active region and a second active region disposed at least partially above the isolation layer, wherein the first active region and the second active region each comprise a long axis and a short axis, wherein the long axes of the first and second active regions are substantially parallel and extend in a first direction;

forming a first gate structure and a second gate structure disposed on the isolation layer, the first active region, and the second active region, wherein the first gate structure and the second gate structure each comprise a long axis and a short axis, wherein the long axes of the first and second gate structures are substantially parallel and extend in a second direction, wherein the second direction is substantially perpendicular to the first direction;

forming a high-κ material on the isolation layer, the first active region, the second active region, the first gate structure, and the second gate structure, such that a rectangular portion of the isolation layer between the first active region and the second active region, and between and in contact with the first gate structure and the second gate structure, remains exposed;

forming an isolation pillar material on the rectangular portion of the isolation layer, wherein the isolation pillar material has a rectangular shape in a sectional view taken across the first direction and lower portions of two opposed sides of the isolation pillar material are in contact with the high-κ material; and trimming upper portions of the two opposed sides of the isolation pillar material, wherein the upper portions are above the lower portions, to yield an isolation pillar disposed on the isolation layer, between the first and second active regions, and between and in contact with the first and second gate structures, wherein the isolation pillar has an inverted-T shape in a sectional view taken across the first direction.

8. The method of claim 7, further comprising:
removing the high-κ material from the isolation layer, the first active region, the second active region, the first gate structure, and the second gate structure.

9. The method of claim 7, further comprising:
performing a replacement metal gate (RMG) process on the first gate structure and the second gate structure.

10. The method of claim 7, wherein forming the isolation pillar material comprises depositing silicon nitride.

11. The method of claim 7, wherein providing the semiconductor substrate comprises structuring a silicon material.

12. The method of claim 7, wherein providing the isolation layer comprises positioning silicon oxide.

13. The method of claim 7, wherein forming the first active region and the second active region comprises forming nanosheet structures.

14. The method of claim 7, wherein forming the first active region and the second active region comprises forming a fin structure.

15. The method of claim 7, wherein forming the first gate structure and the second gate structure each comprise forming a gate poly layer; a capping layer disposed on the gate poly layer; and a spacer disposed on sides of the gate poly layer and sides of the capping layer.

16. The method of claim 7, wherein the high-κ material is selected from the group consisting of hafnium oxide and aluminum oxide.

17. A system, comprising:
a semiconductor device processing system to manufacture a semiconductor device; and
a processing controller operatively coupled to said semiconductor device processing system, said processing controller configured to control an operation of the semiconductor device processing system;
wherein the semiconductor device processing system is adapted to:
provide a semiconductor substrate;
provide an isolation layer disposed on the semiconductor substrate;
form a first active region and a second active region disposed at least partially above the isolation layer, wherein the first active region and the second active region each comprise a long axis and a short axis, wherein the long axes of the first and second active regions are substantially parallel and extend in a first direction;
form a first gate structure and a second gate structure disposed on the isolation layer, the first active region, and the second active region, wherein the first gate structure and the second gate structure each comprise a long axis and a short axis, wherein the long axes of the first and second gate structures are substantially parallel and extend in a second direction, wherein the second direction is substantially perpendicular to the first direction; and
form an isolation structure disposed on the isolation layer, between the first and second active regions, and between and in contact with the first and second gate structures, wherein the isolation structure has an inverted-T shape in a sectional view taken across the first direction.

18. The system of claim 17, wherein the semiconductor device processing system is further adapted to:
perform a replacement metal gate (RMG) process on the first gate structure and the second gate structure.

* * * * *